United States Patent
Lee et al.

(10) Patent No.: US 9,997,397 B2
(45) Date of Patent: Jun. 12, 2018

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Tung-Ying Lee, Hsinchu (TW); Meng-Ku Chen, New Taipei (TW); Yu-Lien Huang, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 14/739,418

(22) Filed: Jun. 15, 2015

(65) Prior Publication Data
US 2016/0240427 A1 Aug. 18, 2016

Related U.S. Application Data

(60) Provisional application No. 62/116,103, filed on Feb. 13, 2015.

(51) Int. Cl.
*H01L 21/76* (2006.01)
*H01L 21/763* (2006.01)
*H01L 21/02* (2006.01)

(52) U.S. Cl.
CPC ........ *H01L 21/763* (2013.01); *H01L 21/0243* (2013.01); *H01L 21/0245* (2013.01); *H01L 21/02381* (2013.01); *H01L 21/02494* (2013.01); *H01L 21/02532* (2013.01)

(58) Field of Classification Search
CPC ................. H01L 29/267; H01L 21/763; H01L 21/02381; H01L 21/0243; H01L 21/0245
See application file for complete search history.

(56) References Cited

U.S. PATENT DOCUMENTS

| 7,060,597 B2 | 6/2006 | Kurita et al. |
| 7,683,386 B2 * | 3/2010 | Tanaka ................. H01L 21/0237 257/88 |
| 8,492,745 B2 | 7/2013 | Li et al. |
| 8,709,846 B2 | 4/2014 | Rana et al. |
| 8,748,932 B2 | 6/2014 | Jeong et al. |
| 8,853,829 B2 | 10/2014 | Miyoshi et al. |
| 8,900,915 B2 | 12/2014 | Rockenberger et al. |

(Continued)

FOREIGN PATENT DOCUMENTS

| CN | 102485944 A | 6/2012 |
| CN | 102623598 A | 8/2012 |

(Continued)

OTHER PUBLICATIONS

Li et al., "Defect reduction in epitaxial InP on nanostructured Si (001) substrates with position-controlled seed arrays," Journal of Crystal Growth 405 (2014) 81-86.

*Primary Examiner* — Matthew Reames
(74) *Attorney, Agent, or Firm* — Maschoff Brennan

(57) ABSTRACT

A semiconductor structure includes a substrate, at least one first epitaxial layer, and at least one second epitaxial layer. The substrate has a plurality of recesses multidimensionally arranged therein. The first epitaxial layer is disposed at least in the recesses of the substrate. The second epitaxial layer is disposed on the first epitaxial layer.

20 Claims, 9 Drawing Sheets

(56) References Cited

U.S. PATENT DOCUMENTS

| | | | |
|---|---|---|---|
| 8,952,400 B2* | 2/2015 | Jung | ............... H01L 33/02 |
| | | | 257/257 |
| 9,362,451 B2 | 6/2016 | Jung et al. | |
| 2002/0039833 A1* | 4/2002 | Bensahel | ............... B82Y 10/00 |
| | | | 438/503 |
| 2005/0179130 A1 | 8/2005 | Tanaka et al. | |
| 2010/0078678 A1 | 4/2010 | Kokawa et al. | |
| 2012/0187365 A1* | 7/2012 | Jeong | ............... H01L 33/10 |
| | | | 257/9 |
| 2012/0318947 A1 | 12/2012 | Riemenschneider et al. | |
| 2013/0119403 A1 | 5/2013 | Vielemeyer | |
| 2014/0231748 A1* | 8/2014 | Kim | ............... H01L 33/22 |
| | | | 257/13 |
| 2014/0273368 A1 | 9/2014 | Hung et al. | |
| 2015/0270441 A1 | 9/2015 | Kim et al. | |

FOREIGN PATENT DOCUMENTS

| | | |
|---|---|---|
| CN | 102742036 A | 10/2012 |
| CN | 102822985 A | 12/2012 |
| CN | 102983243 A | 3/2013 |
| CN | 103109351 A | 5/2013 |
| CN | 104011885 A | 8/2014 |
| JP | 2004-356164 A | 12/2004 |
| JP | 2005-012196 A | 1/2005 |
| JP | 2011-238884 A | 11/2011 |
| KR | 10-2013-0112868 A | 10/2013 |

* cited by examiner

SEMICONDUCTOR STRUCTURE AND MANUFACTURING METHOD THEREOF

PRIORITY CLAIM AND CROSS-REFERENCE

This application claims priority to U.S. Provisional Application Ser. No. 62/116,103, filed Feb. 13, 2015, which is herein incorporated by reference.

BACKGROUND

Integration of lattice mismatched semiconductor materials is one path to high performance semiconductor devices, such as complementary metal-oxide-semiconductor (CMOS) field-effect transistors (FET), due to their high carrier mobility. For example, germanium (Ge) heteroepitaxy on silicon (Si) is promising both for, for example, high-performance p-channel metal-oxide-semiconductor field-effect transistors (p-channel MOSFETs) and as a potential path for integrating optoelectronic devices with silicon CMOS technology. Heteroepitaxially growing germanium on silicon also is a path for providing a substitute for germanium wafers for many other applications such as photovoltaics and light-emitting diodes, provided that a germanium surface can be obtained cost-effectively.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
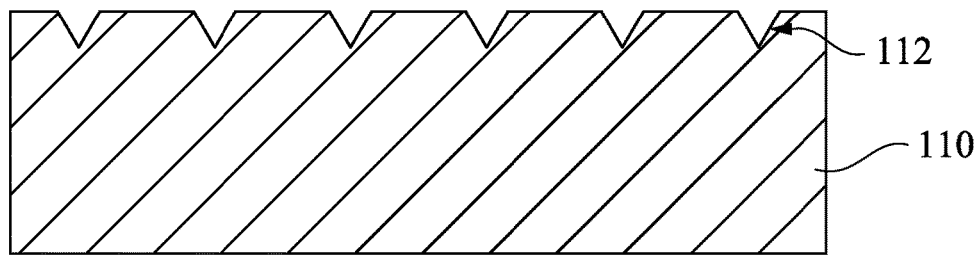
FIGS. 1-3 are cross-sectional views of a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
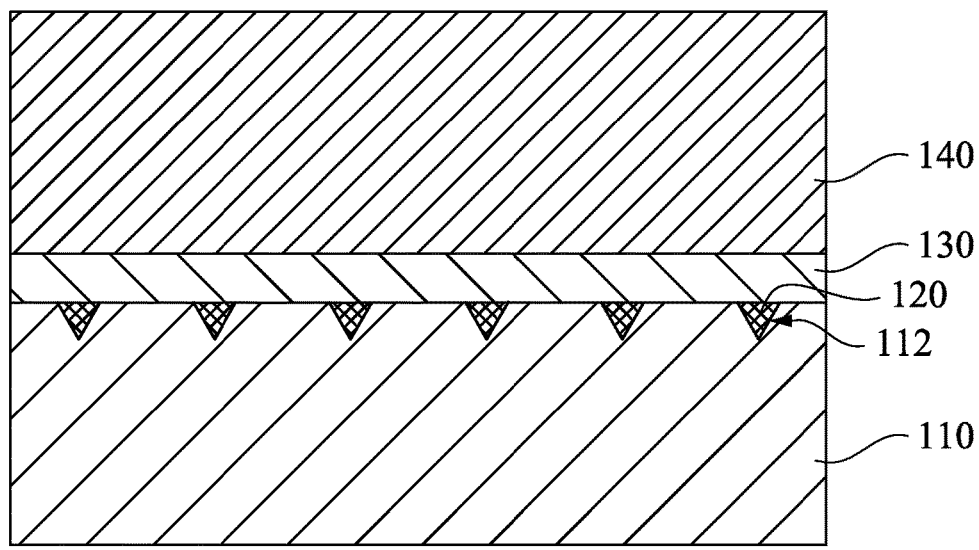
Figure 3:
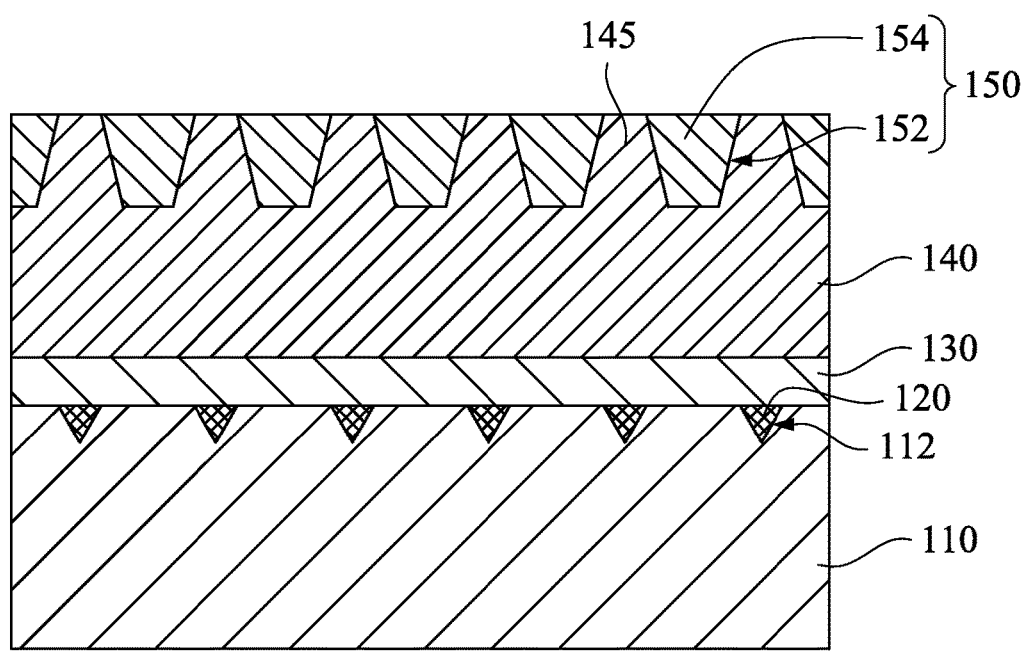
Figure 4:
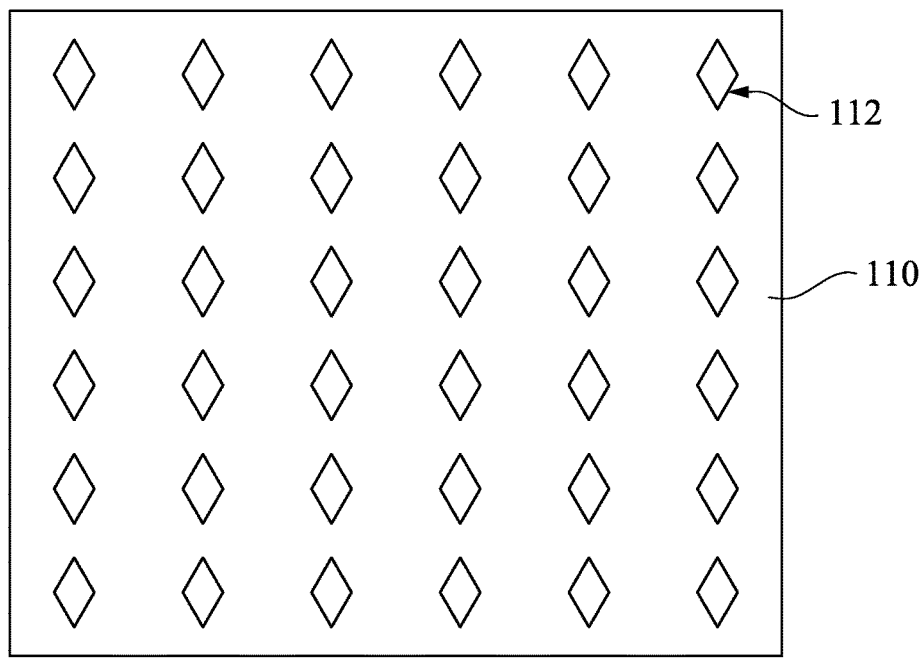
FIGS. 4-5 are top views of a substrate of FIG. 1 in accordance with some embodiments of the present disclosure.
Figure 5:
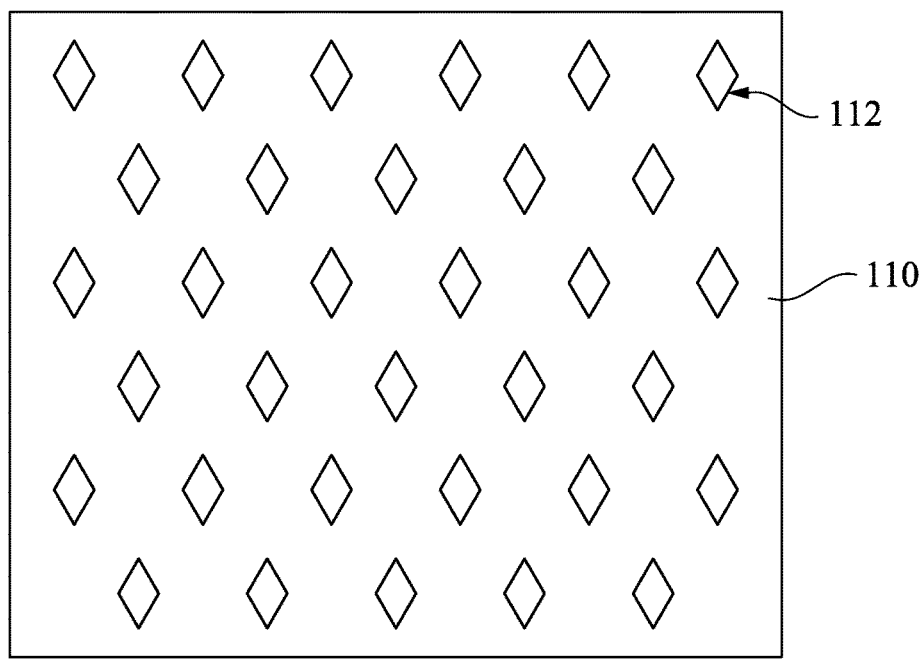

FIGS. 1-3 are cross-sectional views of a semiconductor structure at various stages in accordance with some embodiments of the present disclosure. FIGS. 4-5 are top views of a substrate 110 of FIG. 1 in accordance with some embodiments of the present disclosure.

Reference is made to FIG. 1. A plurality of first recesses 112 are formed in a substrate 110. The substrate 110 is made of a semiconductor material, such as crystalline silicon. The substrate 110 is, for example, bulk silicon or an active layer of a silicon on insulator (SOI) substrate.

The first recesses 112 are formed by a photolithography and etching process. The photolithography and etching process includes photoresist application, exposure, developing, etching, and photoresist removal. The photoresist is applied onto the substrate 110 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. Portions of the substrate 110 which are not protected by the remaining photoresist are etched to form the first recesses 112. After etching the substrate 110, the photoresist is removed from the substrate 110 by, for example, ashing or stripping.

The etching of the substrate 110 may be, for example, anisotropic wet etching. When the substrate 110 is made of crystalline silicon, an etchant used to etch the substrate 110 may be, for example, a potassium hydroxide (KOH)-based solution, an ethylenediamine pyrocatechol (EPD)-based solution, a tetramethylammonium hydroxide (TMAH)-based solution, or combinations thereof. KOH displays an etch rate selectivity 400 times higher in <100> crystal directions than in <111> directions. EPD displays an etch rate selectivity 35 times higher in <100> crystal directions than in <111> directions. TMAH displays an etch rate selectivity from 12.5 to 50 times higher in <100> crystal directions than in <111> directions. Therefore, the first recesses 112 formed by the anisotropic wet etching may have V-shaped cross sections.

FIGS. 4-5 are top views of the substrate 110 of FIG. 1 in accordance with some embodiments of the present disclosure. The first recesses 112 are multidimensionally arranged in the substrate 110. That is, the first recesses 112 are arranged along at least two crossing lines, such as rows and columns. In some embodiments, the first recesses 112 are arranged in a non-staggered pattern (as shown in FIG. 4). In some other embodiments, the first recesses 112 are arranged in a staggered pattern (as shown in FIG. 5). In some embodiments, the first recesses 112 are rhombus-shaped when viewed from the top (as shown in FIGS. 4 and 5).

In some embodiments, the first recesses 112 occupy an area on a top surface of the substrate 110, and the ratio of the area occupied by the first recesses 112 to the top surface of the substrate 110 is in a range from about 10% to about 90%. In some embodiments, at least one of the first recesses 112 has at least one dimension in a range from about 10 nm to 1000 nm.

Reference is made to FIG. 2. A first epitaxial layer 120 is formed at least in the first recesses 112, a second epitaxial layer 130 is formed on the first epitaxial layer 120, and a third epitaxial layer 140 is formed on the second epitaxial layer 130. The first epitaxial layer 120, the second epitaxial layer 130, and/or the third epitaxial layer 140 are made of a material or materials which have lattice mismatches to the substrate 110. In some embodiments, the first epitaxial layer 120, the second epitaxial layer 130, and/or the third epitaxial layer 140 are made of germanium or silicon-germanium. The lattice mismatch between germanium and silicon is about 4%. In some other embodiments, the first epitaxial layer 120, the second epitaxial layer 130, and/or the third epitaxial layer 140 are made of an III-V compound or III-V compounds. The lattice mismatch between an III-V compound and silicon is in a range from about 8% to about 12%. Therefore, if the first recesses 112 were absent from the substrate 110, the first epitaxial layer 120, the second epitaxial layer 130, and/or the third epitaxial layer 140 might have epitaxial defects due to the lattice mismatch between the first epitaxial layer 120 and the substrate 110. The epitaxial defects may be, for example, threading dislocations (TDs).

Since the first epitaxial layer 120 is formed in the first recesses 112, the threading dislocations (TDs) in the first epitaxial layer 120 terminate at sidewalls of the first recesses 112. Furthermore, since the first recesses 112 are multidimensionally arranged, the first recesses 112 can multidimensionally terminate the TDs in the first epitaxial layer 120. That is, the TDs extending along different directions can be trapped in the first recesses 112.

In some embodiments, lattice parameters of the substrate 110, the first epitaxial layer 120, the second epitaxial layer 130, and the third epitaxial layer 140 vary from the substrate 110 towards a direction away from the substrate 110. That is, the lattice parameter of the first epitaxial layer 120 is between the lattice parameter of the second epitaxial layer 130 and the lattice parameter of the substrate 110, the lattice parameter of the second epitaxial layer 130 is between the lattice parameter of the third epitaxial layer 140 and the lattice parameter of the first epitaxial layer 120, and/or the lattice parameter of the second epitaxial layer 130 is between the lattice parameter of the third epitaxial layer 140 and the lattice parameter of the substrate 110. Therefore, a lattice mismatch between the first epitaxial layer 120 and the substrate 110 is less than a lattice mismatch between the second epitaxial layer 130 and the substrate 110, the lattice mismatch between the first epitaxial layer 120 and the substrate 110 is less than a lattice mismatch between the third epitaxial layer 140 and the substrate 110, a lattice mismatch between the second epitaxial layer 130 and the first epitaxial layer 120 is less than a lattice mismatch between the third epitaxial layer 140 and the first epitaxial layer 120, the lattice mismatch between the second epitaxial layer 130 and the first epitaxial layer 120 is less than the lattice mismatch between the third epitaxial layer 140 and the substrate 110, the lattice mismatch between the second epitaxial layer 130 and the substrate 110 is less than the lattice mismatch between the third epitaxial layer 140 and the substrate 110, a lattice mismatch between the third epitaxial layer 140 and the second epitaxial layer 130 is less than the lattice mismatch between the third epitaxial layer 140 and the first epitaxial layer 120, and/or the lattice mismatch between the third epitaxial layer 140 and the second epitaxial layer 130 is less than the lattice mismatch between the third epitaxial layer 140 and the substrate 110. Since the lattice mismatches between adjacent of the substrate 110, the first epitaxial layer 120, the second epitaxial layer 130, and the third epitaxial layer 140 are reduced, the threading dislocations (TDs) created from the interfaces between adjacent of the substrate 110, the first epitaxial layer 120, the second epitaxial layer 130, and the third epitaxial layer 140 are reduced as well.

In some embodiments, a lattice mismatch between the first epitaxial layer 120 and the substrate 110 may be greater than a lattice mismatch between the second epitaxial layer 130 and the substrate 110. In such embodiments, threading dislocations (TDs) tend to be created from the interface between the first epitaxial layer 120 and the substrate 110. Since the first epitaxial layer 120 is formed in the first recesses 112, the TDs created from the interface between the first epitaxial layer 120 and the substrate 110 can be trapped in the first recesses 112.

In some embodiments, the lattice parameter of at least one of the first epitaxial layer 120, the second epitaxial layer 130, and the third epitaxial layer 140 may be constant. In some other embodiments, the lattice parameter of at least one of the first epitaxial layer 120, the second epitaxial layer 130, and the third epitaxial layer 140 may vary along its thickness.

When the substrate 110 is made of silicon, and the first epitaxial layer 120, the second epitaxial layer 130, and the third epitaxial layer 140 are made of silicon-germanium or germanium, the lattice parameters of the substrate 110, the first epitaxial layer 120, the second epitaxial layer 130, and the third epitaxial layer 140 increase from the substrate 110 towards the direction away from the substrate 110. That is, the lattice parameter of the first epitaxial layer 120 is greater than the lattice parameter of the substrate 110, the lattice parameter of the second epitaxial layer 130 is greater than the lattice parameter of the first epitaxial layer 120, and/or the lattice parameter of the third epitaxial layer 140 is greater than the lattice parameter of the second epitaxial layer 130.

Since germanium has higher lattice parameter than that of silicon, the lattice parameter of silicon-germanium or germanium increases as its germanium content increases. Therefore, the germanium contents of the substrate 110, the first epitaxial layer 120, the second epitaxial layer 130, and the third epitaxial layer 140 increase from the substrate 110 towards the direction away from the substrate 110 when the substrate 110 is made of silicon, and the first epitaxial layer 120, the second epitaxial layer 130, and the third epitaxial layer 140 are made of silicon-germanium or germanium. That is, the germanium content of the first epitaxial layer 120 is greater than the germanium content of the substrate 110, the germanium content of the second epitaxial layer 130 is greater than the germanium content of the first epitaxial layer 120, and/or the germanium content of the third epitaxial layer 140 is greater than the germanium content of the second epitaxial layer 130.

In some embodiments, the germanium content of at least one of the first epitaxial layer 120, the second epitaxial layer 130, and the third epitaxial layer 140 may be constant. In some other embodiments, the germanium content of at least one of the first epitaxial layer 120, the second epitaxial layer 130, and the third epitaxial layer 140 may vary along its thickness.

In some embodiments, at least two of the first epitaxial layer 120, the second epitaxial layer 130, and the third epitaxial layer 140 may have different lattice parameters. In some other embodiments, at least two of the first epitaxial layer 120, the second epitaxial layer 130, and the third epitaxial layer 140 may have the same lattice parameter and may be made of the same material. In the embodiments that at least two of the first epitaxial layer 120, the second epitaxial layer 130, and the third epitaxial layer 140 have the same lattice parameter and are made of the same material, an interface between said at least two of the first epitaxial layer 120, the second epitaxial layer 130, and the third epitaxial layer 140 may be absent, and thus said at least two of the first epitaxial layer 120, the second epitaxial layer 130, and the third epitaxial layer 140 may be considered an epitaxial layer.

The first epitaxial layer 120, the second epitaxial layer 130, and the third epitaxial layer 140 may be formed by, for example, molecular beam epitaxy (MBE) or chemical vapor deposition (CVD). Specifically, the first epitaxial layer 120 overfills the first recesses 112. Then, the excess first epitaxial layer 120 outside of the first recesses 112 is removed through a removal process. In some embodiments, the first epitaxial layer 120 over burden is removed by a chemical mechanical polishing (CMP) process. After the removal process, the second epitaxial layer 130 is formed on the first epitaxial layer 120 and the substrate 110. Then, an optional planarization process may be performed on the second epitaxial layer 130. The planarization process performed on the second epitaxial layer 130 is, for example, a CMP process. Then, the third epitaxial layer 140 is formed on the second epitaxial layer 130. After the formation of the third epitaxial layer 140, another optional planarization process may be performed on the third epitaxial layer 140. Similarly, the planarization process performed on the third epitaxial layer 140 is, for example, a CMP process.

After the third epitaxial layer 140 is formed, a dopant implantation process is performed on the third epitaxial layer 140 to form active areas in the third epitaxial layer 140. The active areas will be used for components of active devices, such as re-channel metal-oxide-semiconductor field-effect transistors (n-channel MOSFETs), p-channel MOSFETs, planar MOSFETs, or fin field-effect transistors (finFETs), to be formed later. If an n-channel MOSFET will be formed on an active area, a p-well is formed in the active area. If a p-channel MOSFET will be formed on an active area, an n-well is formed in the active area.

If the third epitaxial layer 140 is made of a Group IV semiconductor material, such as germanium or silicon-germanium, the dopants can be acceptors from Group III or donors from Group V elements. For example, boron (B), aluminium (Al), indium (In), gallium (Ga), or combinations thereof, having three valence electrons, can be used as the dopants to form a p-well in the third epitaxial layer 140 when the third epitaxial layer 140 is made of a Group IV semiconductor material with four valence electrons. On the other hand, phosphorus (P), arsenic (As), antimony (Sb), bismuth (Bi), or combinations thereof, having five valence electrons, can be used as the dopants to form an n-well in the third epitaxial layer 140 when the third epitaxial layer 140 is made of a Group IV semiconductor material with four valence electrons.

In some embodiments, the active areas where p-channel metal-oxide-semiconductor field-effect transistors (p-channel MOSFETs) and n-channel MOSFETs will be formed are made of substantially the same material, such as germanium or silicon-germanium. In some other embodiments, the active areas where p-channel MOSFETs will be formed are made of germanium or silicon-germanium, and the active areas where n-channel MOSFETs will be formed are made of an III-V compound or III-V compounds. In such embodiments, the active areas where p-channel MOSFETs will be formed and the active areas where n-channel MOSFETs will be formed may be formed separately. That is, the first epitaxial layer 120, the second epitaxial layer 130, and the third epitaxial layer 140 are formed, patterned, and implanted to form some active areas, and then one or more other epitaxial layers are formed and implanted to form other active areas.

Reference is made to FIG. 3. A plurality of isolation structures 150 are formed at least partially in the third epitaxial layer 140 to separate the active areas 145. In some embodiments, the isolation structures 150 are, for example, shallow trench isolation (STI) structures. Specifically, a hard mask layer is formed on the third epitaxial layer 140 and is patterned to form openings therein to expose portions of the third epitaxial layer 140. Then, the exposed portions of the third epitaxial layer 140 are etched to form trenches 152 in the third epitaxial layer 140. The etching for forming the trenches 152 may be, for example, reactive-ion etching (RIE). After the formation of the trenches 152, a dielectric material 154 overfills the trenches 152. The dielectric material 154 is, for example, silicon oxide, silicon nitride, a cured flowable dielectric material, or combinations thereof. Then, the excess dielectric material 154 outside of the trenches 154 is removed by, for example, chemical mechanical polishing (CMP). After the CMP, the hard mask layer is removed from the third epitaxial layer 140 to form the isolation structures 150.

After the isolation structures 150 are formed, one or more process steps may be performed to form one or more components of active devices, such as n-channel metal-oxide-semiconductor field-effect transistors (n-channel MOSFETs), p-channel MOSFETs, planar MOSFETs, or fin field-effect transistors (finFETs), on the active areas 145. Since the threading dislocations (TDs) in the first epitaxial layer 120 are trapped in the first recesses 112, and the TDs created from the interfaces between the substrate 110, the first epitaxial layer 120, the second epitaxial layer 130, and the third epitaxial layer 140 are reduced, the TDs in the active areas 145 can be eliminated or reduced to an acceptable level.

Figure 6:
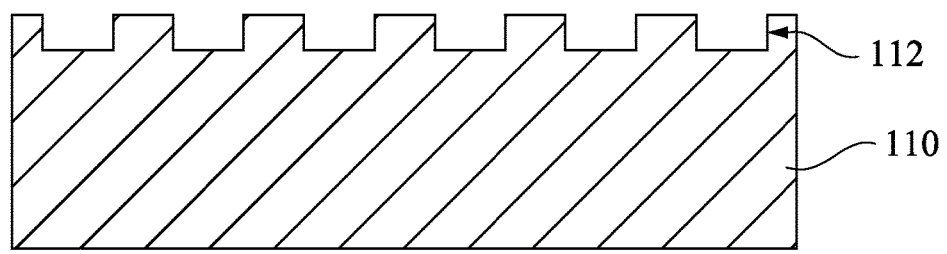
FIGS. 6-8 are cross-sectional views of a semiconductor structure at various stages in accordance with some embodiments of the present disclosure.
Figure 7:
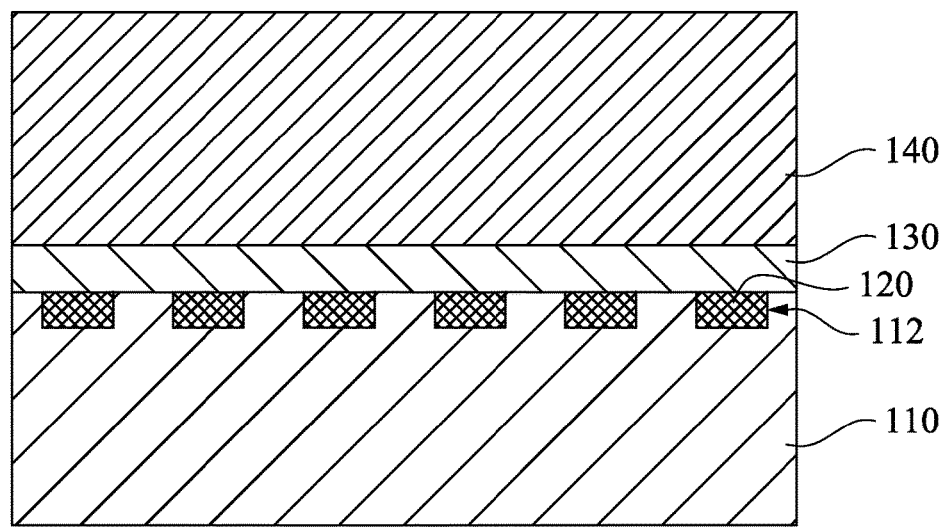
Figure 8:
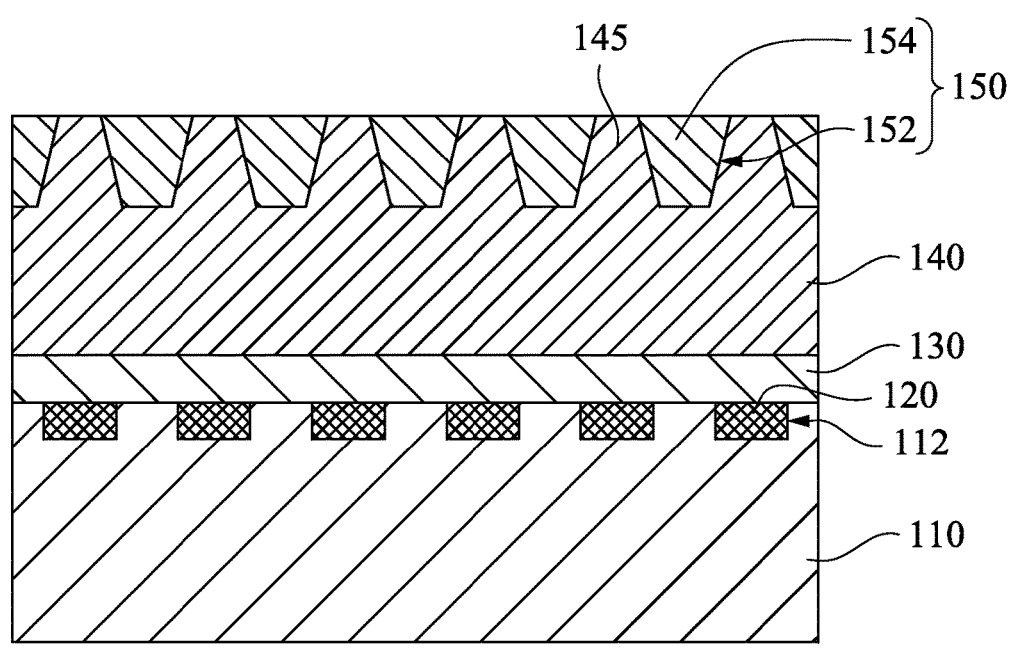

FIGS. 6-8 are cross-sectional views of a semiconductor structure at various stages in accordance with some embodiments of the present disclosure. FIGS. 9-12 are top views of a substrate 110 of FIG. 6 in accordance with some embodiments of the present disclosure.

Reference is made to FIG. 6. A plurality of first recesses 112 are formed in a substrate 110. The substrate 110 is made of a semiconductor material, such as crystalline silicon. The substrate 110 is, for example, bulk silicon or an active layer of a silicon on insulator (SOI) substrate.

The first recesses 112 are formed by a photolithography and etching process. The photolithography and etching process includes photoresist application, exposure, developing, etching, and photoresist removal. The photoresist is applied onto the substrate 110 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. Portions of the substrate 110 which are not protected by the remaining photoresist are etched to form the first recesses 112. After etching the substrate 110, the photoresist is removed from the substrate 110 by, for example, ashing or stripping.

The etching of the substrate 110 may be dry etching, such as reactive-ion etching (RIE). RIE is a type of dry etching which has different characteristics than wet etching. RIE uses chemically reactive plasma to form the first recesses 112. The plasma is generated under low pressure (vacuum) by an electromagnetic field. High-energy ions from the chemically reactive plasma attack the substrate 110 and react with it. In some embodiments, chlorine (Cl) or bromine (Br) based RIE can be used to form the first recesses 112. The first recesses 112 formed by RIE may have rectangular cross sections or U-shaped cross sections.

Figure 9:
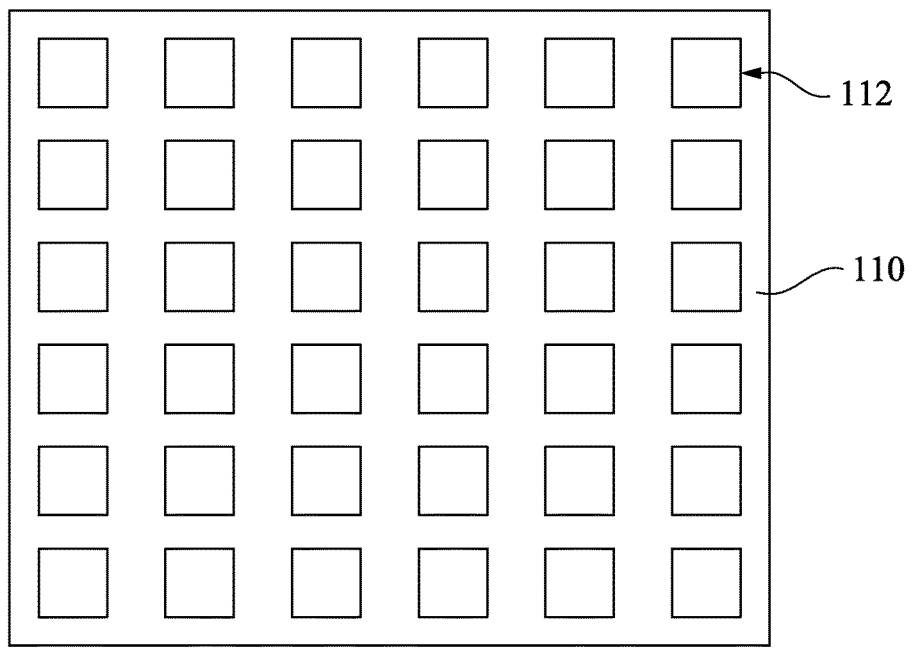
FIGS. 9-12 are top views of a substrate of FIG. 6 in accordance with some embodiments of the present disclosure.
Figure 10:
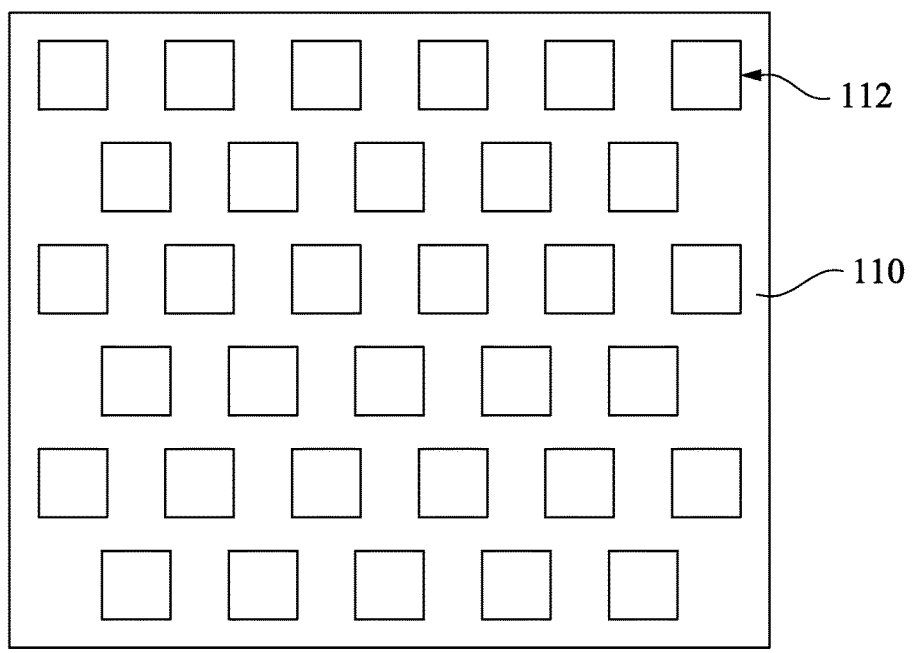
Figure 11:
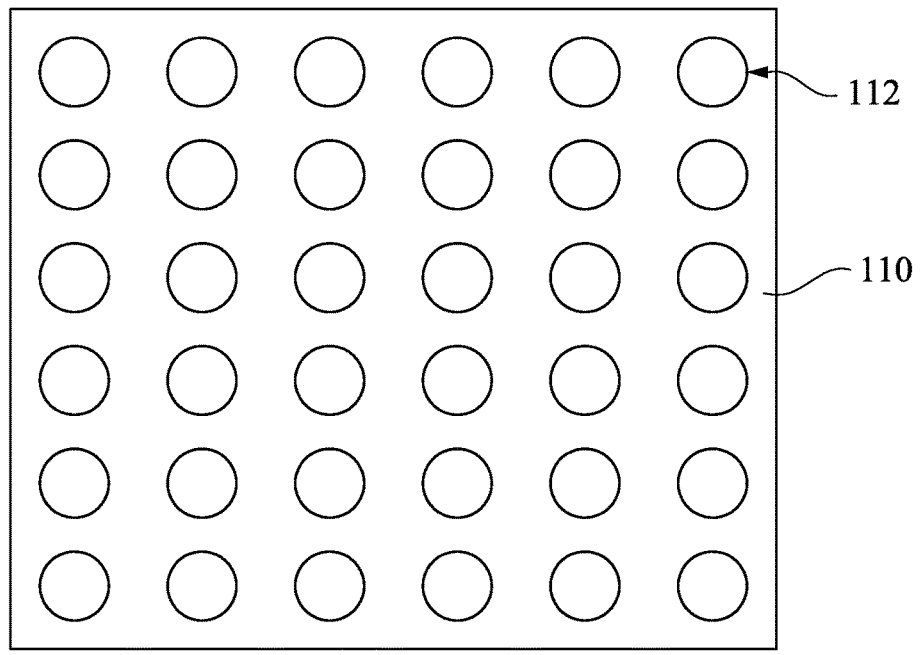
Figure 12:
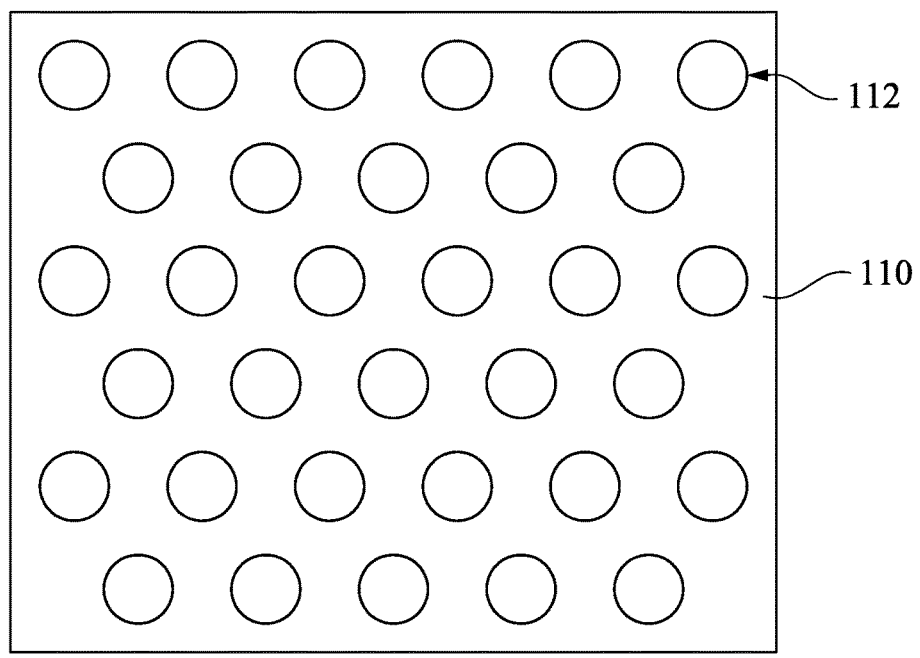

FIGS. 9-12 are top views of the substrate 110 of FIG. 6 in accordance with some embodiments of the present disclosure. The first recesses 112 are multidimensionally arranged in the substrate 110. That is, the first recesses 112 are arranged along at least two crossing lines, such as rows and columns. In some embodiments, the first recesses 112 are arranged in a non-staggered pattern (as shown in FIGS. 9 and 11). In some other embodiments, the first recesses 112 are arranged in a staggered pattern (as shown in FIGS. 10 and 12). In some embodiments, the first recesses 112 are rectangular when viewed from the top (as shown in FIGS. 9 and 10). In some other embodiments, the first recesses 112 are circular when viewed from the top (as shown in FIGS. 11 and 12).

In some embodiments, the first recesses 112 occupy an area on a top surface of the substrate 110, and the ratio of the area occupied by the first recesses 112 to the top surface of the substrate 110 is in a range from about 10% to about 90%. In some embodiments, at least one of the first recesses 112 has at least one dimension in a range from about 10 nm to 1000 nm.

Reference is made to FIG. 7. A first epitaxial layer 120 is formed at least in the first recesses 112, a second epitaxial layer 130 is formed on the first epitaxial layer 120, and a third epitaxial layer 140 is formed on the second epitaxial layer 130. The first epitaxial layer 120, the second epitaxial layer 130, and/or the third epitaxial layer 140 are made of a material or materials which have lattice mismatches to the substrate 110. In some embodiments, the first epitaxial layer 120, the second epitaxial layer 130, and/or the third epitaxial layer 140 are made of germanium or silicon-germanium. The lattice mismatch between germanium and silicon is about 4%. In some other embodiments, the first epitaxial layer 120, the second epitaxial layer 130, and/or the third epitaxial layer 140 are made of an III-V compound or III-V compounds. The lattice mismatch between an III-V compound and silicon is in a range from about 8% to about 12%. Therefore, if the first recesses 112 were absent from the substrate 110, the first epitaxial layer 120, the second epitaxial layer 130, and/or the third epitaxial layer 140 might have epitaxial defects due to the lattice mismatch between the first epitaxial layer 120 and the substrate 110. The epitaxial defects may be, for example, threading dislocations (TDs).

Since the first epitaxial layer 120 is formed in the first recesses 112, the threading dislocations (TDs) in the first epitaxial layer 120 terminate at sidewalls of the first recesses 112. Furthermore, since the first recesses 112 are multidimensionally arranged, the first recesses 112 can multidimensionally terminate the TDs in the first epitaxial layer 120. That is, the TDs extending along different directions can be trapped in the first recesses 112.

In some embodiments, lattice parameters of the substrate 110, the first epitaxial layer 120, the second epitaxial layer 130, and the third epitaxial layer 140 vary from the substrate 110 towards a direction away from the substrate 110. That is, the lattice parameter of the first epitaxial layer 120 is between the lattice parameter of the second epitaxial layer 130 and the lattice parameter of the substrate 110, the lattice parameter of the second epitaxial layer 130 is between the lattice parameter of the third epitaxial layer 140 and the lattice parameter of the first epitaxial layer 120, and/or the lattice parameter of the second epitaxial layer 130 is between the lattice parameter of the third epitaxial layer 140 and the lattice parameter of the substrate 110. Therefore, a lattice mismatch between the first epitaxial layer 120 and the substrate 110 is less than a lattice mismatch between the second epitaxial layer 130 and the substrate 110, the lattice mismatch between the first epitaxial layer 120 and the substrate 110 is less than a lattice mismatch between the third epitaxial layer 140 and the substrate 110, a lattice mismatch between the second epitaxial layer 130 and the first epitaxial layer 120 is less than a lattice mismatch between the third epitaxial layer 140 and the first epitaxial layer 120, the lattice mismatch between the second epitaxial layer 130 and the first epitaxial layer 120 is less than the lattice mismatch between the third epitaxial layer 140 and the substrate 110, the lattice mismatch between the second epitaxial layer 130 and the substrate 110 is less than the lattice mismatch between the third epitaxial layer 140 and the substrate 110, a lattice mismatch between the third epitaxial layer 140 and the second epitaxial layer 130 is less than the lattice mismatch between the third epitaxial layer 140 and the first epitaxial layer 120, and/or the lattice mismatch between the third epitaxial layer 140 and the second epitaxial layer 130 is less than the lattice mismatch between the third epitaxial layer 140 and the substrate 110. Since the lattice mismatches between adjacent of the substrate 110, the first epitaxial layer 120, the second epitaxial layer 130, and the third epitaxial layer 140 are reduced, the threading dislocations (TDs) created from the interfaces between adjacent of the substrate 110, the first epitaxial layer 120, the second epitaxial layer 130, and the third epitaxial layer 140 are reduced as well.

In some embodiments, a lattice mismatch between the first epitaxial layer 120 and the substrate 110 may be greater than a lattice mismatch between the second epitaxial layer 130 and the substrate 110. In such embodiments, threading dislocations (TDs) tend to be created from the interface between the first epitaxial layer 120 and the substrate 110. Since the first epitaxial layer 120 is formed in the first recesses 112, the TDs created from the interface between the first epitaxial layer 120 and the substrate 110 can be trapped in the first recesses 112.

In some embodiments, the lattice parameter of at least one of the first epitaxial layer 120, the second epitaxial layer 130, and the third epitaxial layer 140 may be constant. In some other embodiments, the lattice parameter of at least one of the first epitaxial layer 120, the second epitaxial layer 130, and the third epitaxial layer 140 may vary along its thickness.

When the substrate 110 is made of silicon, and the first epitaxial layer 120, the second epitaxial layer 130, and the third epitaxial layer 140 are made of silicon-germanium or germanium, the lattice parameters of the substrate 110, the first epitaxial layer 120, the second epitaxial layer 130, and the third epitaxial layer 140 increase from the substrate 110 towards the direction away from the substrate 110. That is, the lattice parameter of the first epitaxial layer 120 is greater than the lattice parameter of the substrate 110, the lattice parameter of the second epitaxial layer 130 is greater than the lattice parameter of the first epitaxial layer 120, and/or the lattice parameter of the third epitaxial layer 140 is greater than the lattice parameter of the second epitaxial layer 130.

Since germanium has higher lattice parameter than that of silicon, the lattice parameter of silicon-germanium or germanium increases as its germanium content increases. Therefore, the germanium contents of the substrate 110, the first epitaxial layer 120, the second epitaxial layer 130, and the third epitaxial layer 140 increase from the substrate 110 towards the direction away from the substrate 110 when the substrate 110 is made of silicon, and the first epitaxial layer 120, the second epitaxial layer 130, and the third epitaxial layer 140 are made of silicon-germanium or germanium. That is, the germanium content of the first epitaxial layer 120 is greater than the germanium content of the substrate 110, the germanium content of the second epitaxial layer 130 is greater than the germanium content of the first epitaxial layer 120, and/or the germanium content of the third epitaxial layer 140 is greater than the germanium content of the second epitaxial layer 130.

In some embodiments, the germanium content of at least one of the first epitaxial layer 120, the second epitaxial layer 130, and the third epitaxial layer 140 may be constant. In some other embodiments, the germanium content of at least one of the first epitaxial layer 120, the second epitaxial layer 130, and the third epitaxial layer 140 may vary along its thickness.

In some embodiments, at least two of the first epitaxial layer 120, the second epitaxial layer 130, and the third epitaxial layer 140 may have different lattice parameters. In some other embodiments, at least two of the first epitaxial layer 120, the second epitaxial layer 130, and the third epitaxial layer 140 may have the same lattice parameter and may be made of the same material. In the embodiments that at least two of the first epitaxial layer 120, the second epitaxial layer 130, and the third epitaxial layer 140 have the same lattice parameter and are made of the same material, an interface between said at least two of the first epitaxial layer 120, the second epitaxial layer 130, and the third epitaxial layer 140 may be absent, and thus said at least two of the first epitaxial layer 120, the second epitaxial layer 130, and the third epitaxial layer 140 may be considered an epitaxial layer.

The first epitaxial layer 120, the second epitaxial layer 130, and the third epitaxial layer 140 may be formed by, for example, molecular beam epitaxy (MBE) or chemical vapor deposition (CVD). Specifically, the first epitaxial layer 120 overfills the first recesses 112. Then, the excess first epitaxial layer 120 outside of the first recesses 112 is removed through a removal process. In some embodiments, the first epitaxial layer 120 over burden is removed by a chemical mechanical polishing (CMP) process. After the removal process, the second epitaxial layer 130 is formed on the first epitaxial layer 120 and the substrate 110. Then, an optional planarization process may be performed on the second epitaxial layer 130. The planarization process performed on the second epitaxial layer 130 is, for example, a CMP process. Then, the third epitaxial layer 140 is formed on the second epitaxial layer 130. After the formation of the third epitaxial layer 140, another optional planarization process may be performed on the third epitaxial layer 140. Similarly, the planarization process performed on the third epitaxial layer 140 is, for example, a CMP process.

After the third epitaxial layer 140 is formed, a dopant implantation process is performed on the third epitaxial layer 140 to form active areas in the third epitaxial layer 140. The active areas will be used for components of active devices, such as re-channel metal-oxide-semiconductor field-effect transistors (n-channel MOSFETs), p-channel MOSFETs, planar MOSFETs, or fin field-effect transistors (finFETs), to be formed later. If an n-channel MOSFET will be formed on an active area, a p-well is formed in the active area. If a p-channel MOSFET will be formed on an active area, an n-well is formed in the active area.

If the third epitaxial layer 140 is made of a Group IV semiconductor material, such as germanium or silicon-germanium, the dopants can be acceptors from Group III or donors from Group V elements. For example, boron (B), aluminium (Al), indium (In), gallium (Ga), or combinations thereof, having three valence electrons, can be used as the dopants to form a p-well in the third epitaxial layer 140 when the third epitaxial layer 140 is made of a Group IV semiconductor material with four valence electrons. On the other hand, phosphorus (P), arsenic (As), antimony (Sb), bismuth (Bi), or combinations thereof, having five valence electrons, can be used as the dopants to form an n-well in the third epitaxial layer 140 when the third epitaxial layer 140 is made of a Group IV semiconductor material with four valence electrons.

In some embodiments, the active areas where p-channel metal-oxide-semiconductor field-effect transistors (p-channel MOSFETs) and n-channel MOSFETs will be formed are made of substantially the same material, such as germanium or silicon-germanium. In some other embodiments, the active areas where p-channel MOSFETs will be formed are made of germanium or silicon-germanium, and the active areas where n-channel MOSFETs will be formed are made of an III-V compound or III-V compounds. In such embodiments, the active areas where p-channel MOSFETs will be formed and the active areas where n-channel MOSFETs will be formed may be formed separately. That is, the first epitaxial layer 120, the second epitaxial layer 130, and the third epitaxial layer 140 are formed, patterned, and implanted to form some active areas, and then one or more other epitaxial layers are formed and implanted to form other active areas.

Reference is made to FIG. 8. A plurality of isolation structures 150 are formed at least partially in the third epitaxial layer 140 to separate the active areas 145. In some embodiments, the isolation structures 150 are, for example, shallow trench isolation (STI) structures. Specifically, a hard mask layer is formed on the third epitaxial layer 140 and is patterned to form openings therein to expose portions of the third epitaxial layer 140. Then, the exposed portions of the third epitaxial layer 140 are etched to form trenches 152 in the third epitaxial layer 140. The etching for forming the trenches 152 may be, for example, reactive-ion etching (RIE). After the formation of the trenches 152, a dielectric material 154 overfills the trenches 152. The dielectric material 154 is, for example, silicon oxide, silicon nitride, a cured flowable dielectric material, or combinations thereof. Then, the excess dielectric material 154 outside of the trenches 154 is removed by, for example, chemical mechanical polishing (CMP). After the CMP, the hard mask layer is removed from the third epitaxial layer 140 to form the isolation structures 150.

After the isolation structures 150 are formed, one or more process steps may be performed to form one or more components of active devices, such as n-channel metal-oxide-semiconductor field-effect transistors (n-channel MOSFETs), p-channel MOSFETs, planar MOSFETs, or fin field-effect transistors (finFETs), on the active areas 145. Since the threading dislocations (TDs) in the first epitaxial layer 120 are trapped in the first recesses 112, and the TDs created from the interfaces between the substrate 110, the first epitaxial layer 120, the second epitaxial layer 130, and the third epitaxial layer 140 are reduced, the TDs in the active areas 145 can be eliminated or reduced to an acceptable level.

FIGS. 13-17 are cross-sectional views of a semiconductor structure at various stages in accordance with some embodiments of the present disclosure.

Figure 13:
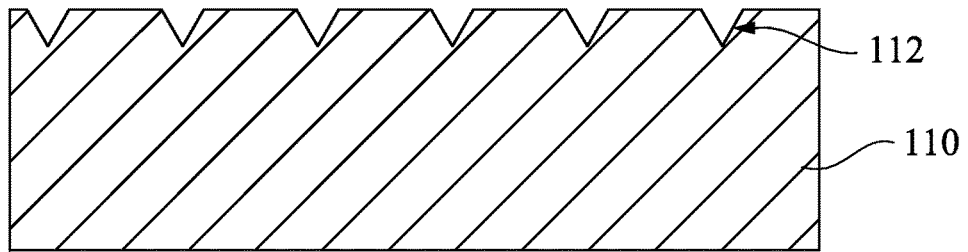
FIGS. 13-17 are cross-sectional views of a semiconductor structure at various stages in accordance with some embodiments of the present disclosure.

Reference is made to FIG. 13. A plurality of first recesses 112 are formed in a substrate 110. The substrate 110 is made of a semiconductor material, such as crystalline silicon. The substrate 110 is, for example, bulk silicon or an active layer of a silicon on insulator (SOI) substrate.

The first recesses 112 are formed by a photolithography and etching process. The photolithography and etching process includes photoresist application, exposure, developing, etching, and photoresist removal. The photoresist is applied onto the substrate 110 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. Portions of the substrate 110 which are not protected by the remaining photoresist are etched to form the first recesses 112. After etching the substrate 110, the photoresist is removed from the substrate 110 by, for example, ashing or stripping.

In some embodiments, the etching of the substrate 110 may be, for example, anisotropic wet etching. When the substrate 110 is made of crystalline silicon, an etchant used to etch the substrate 110 may be, for example, a potassium hydroxide (KOH)-based solution, an ethylenediamine pyrocatechol (EPD)-based solution, a tetramethylammonium hydroxide (TMAH)-based solution, or combinations thereof. Potassium hydroxide (KOH) displays an etch rate selectivity 400 times higher in <100> crystal directions than in <111> directions. Ethylenediamine pyrocatechol (EPD) displays an etch rate selectivity 35 times higher in <100> crystal directions than in <111> directions. Tetramethylammonium hydroxide (TMAH) displays an etch rate selectivity from 12.5 to 50 times higher in <100> crystal directions than in <111> directions. Therefore, the first recesses 112 formed by the anisotropic wet etching may have V-shaped cross sections.

In some other embodiments, the etching of the substrate 110 may be dry etching, such as reactive-ion etching (RIE). RIE is a type of dry etching which has different characteristics than wet etching. RIE uses chemically reactive plasma to form the first recesses 112. The plasma is generated under low pressure (vacuum) by an electromagnetic field. High-energy ions from the chemically reactive plasma attack the substrate 110 and react with it. In some embodiments, chlorine (Cl) or bromine (Br) based RIE can be used to form the first recesses 112. The first recesses 112 formed by RIE may have rectangular cross sections or U-shaped cross sections.

The first recesses 112 are multidimensionally arranged in the substrate 110. That is, the first recesses 112 are arranged along at least two crossing lines, such as rows and columns. In some embodiments, the first recesses 112 are arranged in a non-staggered pattern when viewed from the top. In some other embodiments, the first recesses 112 are arranged in a staggered pattern when viewed from the top. The first recesses 112 may be, for example, rhombus-shaped, rectangular, or circular when viewed from the top.

In some embodiments, the first recesses 112 occupy an area on a top surface of the substrate 110, and the ratio of the area occupied by the first recesses 112 to the top surface of the substrate 110 is in a range from about 10% to about 90%. In some embodiments, at least one of the first recesses 112 has at least one dimension in a range from about 10 nm to 1000 nm.

Figure 14:
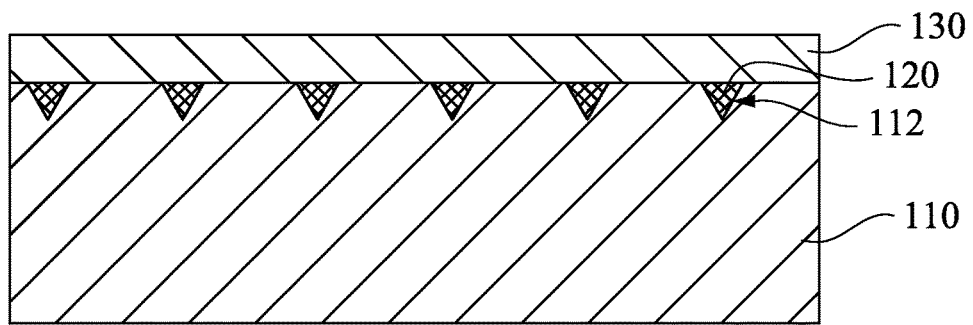

Reference is made to FIG. 14. A first epitaxial layer 120 is formed at least in the first recesses 112, and a second epitaxial layer 130 is formed on the first epitaxial layer 120. The first epitaxial layer 120 and/or the second epitaxial layer 130 are made of a material or materials which have lattice mismatches to the substrate 110. In some embodiments, the first epitaxial layer 120 and/or the second epitaxial layer 130 are made of germanium or silicon-germanium. The lattice mismatch between germanium and silicon is about 4%. In some other embodiments, the first epitaxial layer 120 and/or the second epitaxial layer 130 are made of an III-V compound or III-V compounds. The lattice mismatch between an III-V compound and silicon is in a range from about 8% to about 12%. Therefore, if the first recesses 112 were absent from the substrate 110, the first epitaxial layer 120 and/or the second epitaxial layer 130 might have epitaxial defects due to the lattice mismatch between the first epitaxial layer 120 and the substrate 110. The epitaxial defects may be, for example, threading dislocations (TDs).

Since the first epitaxial layer 120 is formed in the first recesses 112, the threading dislocations (TDs) in the first epitaxial layer 120 terminate at sidewalls of the first recesses 112. Furthermore, since the first recesses 112 are multidimensionally arranged, the first recesses 112 can multidimensionally terminate the TDs in the first epitaxial layer 120. That is, the TDs extending along different directions can be trapped in the first recesses 112.

The first epitaxial layer 120 and the second epitaxial layer 130 may be formed by, for example, molecular beam epitaxy (MBE) or chemical vapor deposition (CVD). Specifically, the first epitaxial layer 120 overfills the first recesses 112. Then, the excess first epitaxial layer 120 outside of the first recesses 112 is removed through a removal process. In some embodiments, the first epitaxial layer 120 over burden is removed by a chemical mechanical polishing (CMP) process. After the removal process, the second epitaxial layer 130 is formed on the first epitaxial layer 120 and the substrate 110. Then, an optional planarization process may be performed on the second epitaxial layer 130. The planarization process is, for example, a chemical mechanical polishing (CMP) process.

Figure 15:
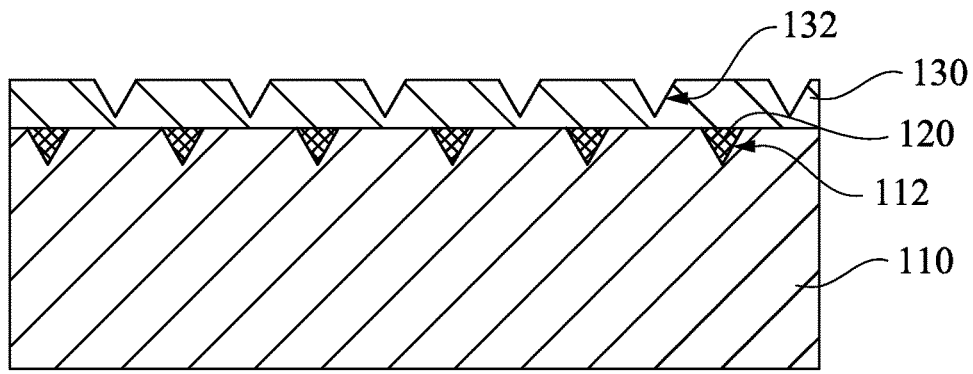

Reference is made to FIG. 15. A plurality of second recesses 132 are formed in the second epitaxial layer 130. The second recesses 132 are formed by a photolithography and etching process. The photolithography and etching process includes photoresist application, exposure, developing, etching, and photoresist removal. The photoresist is applied onto the second epitaxial layer 130 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hardbaked to solidify the remaining photoresist. Portions of the second epitaxial layer 130 which are not protected by the remaining photoresist are etched to form the second recesses 132. After etching the second epitaxial layer 130, the photoresist is removed from the second epitaxial layer 130 by, for example, ashing or stripping.

The etching of the second epitaxial layer 130 may be, for example, anisotropic wet etching or dry etching, such as reactive-ion etching (RIE). The second recesses 132 formed by anisotropic wet etching may have V-shaped cross sections. The second recesses 132 formed by RIE may have rectangular cross sections or U-shaped cross sections.

In some embodiments, the second recesses 132 may be staggered with the first recesses 112. That is, the second recesses 132 may not be aligned with the first recesses 112. In this configuration, at least a portion of the threading dislocations (TDs) that are not trapped in the first recesses 112 terminate at sidewalls of the second recesses 132. Therefore, the TDs can be further reduced. In some other embodiments, the second recesses 132 may be aligned with the first recesses 112.

The second recesses 132 are multidimensionally arranged in the second epitaxial layer 130. That is, the second recesses 132 are arranged along at least two crossing lines, such as rows and columns. In some embodiments, the second recesses 132 are arranged in a non-staggered pattern when viewed from the top. In some other embodiments, the second recesses 132 are arranged in a staggered pattern when viewed from the top. The second recesses 132 may be, for example, rhombus-shaped, rectangular, or circular when viewed from the top.

In some embodiments, the second recesses 132 occupy an area on a top surface of the second epitaxial layer 130, and the ratio of the area occupied by the second recesses 132 to the top surface of the second epitaxial layer 130 is in a range from about 10% to about 90%. In some embodiments, at least one of the second recesses 132 has at least one dimension in a range from about 10 nm to 1000 nm.

Figure 16:
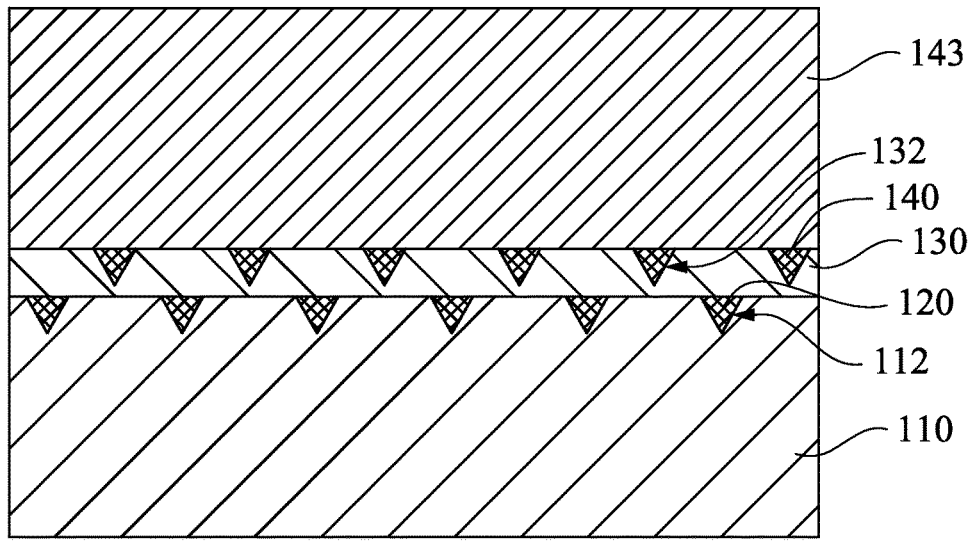

Reference is made to FIG. 16. A third epitaxial layer 140 is formed at least in the second recesses 132, and a fourth epitaxial layer 143 is formed on the third epitaxial layer 140. In some embodiments, the third epitaxial layer 140 and/or the fourth epitaxial layer 143 are made of germanium or silicon-germanium. In some other embodiments, the third epitaxial layer 140 and/or the fourth epitaxial layer 143 are made of an III-V compound or III-V compounds.

Since the third epitaxial layer 140 is formed in the second recesses 132, the threading dislocations (TDs) in the third epitaxial layer 140 terminate at sidewalls of the second recesses 132. Furthermore, since the second recesses 132 are multidimensionally arranged, the second recesses 132 can multidimensionally terminate the TDs in the third epitaxial layer 140. That is, the TDs extending along different directions can be trapped in the second recesses 132.

The third epitaxial layer 140 and the fourth epitaxial layer 143 may be formed by, for example, molecular beam epitaxy (MBE) or chemical vapor deposition (CVD). Specifically, the third epitaxial layer 140 overfills the second recesses 132. Then, the excess third epitaxial layer 140 outside of the second recesses 132 is removed through a removal process. In some embodiments, the third epitaxial layer 140 over burden is removed by a chemical mechanical polishing (CMP) process. After the removal process, the fourth epitaxial layer 143 is formed on the third epitaxial layer 140 and the second epitaxial layer 130. Then, an optional planarization process may be performed on the fourth epitaxial layer 143. The planarization process is, for example, a chemical mechanical polishing (CMP) process.

In some embodiments, lattice parameters of the substrate 110, the first epitaxial layer 120, the second epitaxial layer 130, the third epitaxial layer 140, and the fourth epitaxial layer 143 vary from the substrate 110 towards a direction away from the substrate 110. That is, the lattice parameter of the first epitaxial layer 120 is between the lattice parameter of the second epitaxial layer 130 and the lattice parameter of the substrate 110, the lattice parameter of the second epitaxial layer 130 is between the lattice parameter of the third epitaxial layer 140 and the lattice parameter of the first epitaxial layer 120, the lattice parameter of the second epitaxial layer 130 is between the lattice parameter of the fourth epitaxial layer 143 and the lattice parameter of the substrate 110, and/or the lattice parameter of the third epitaxial layer 140 is between the lattice parameter of the fourth epitaxial layer 143 and the lattice parameter of the second epitaxial layer 130. In this configuration, the lattice mismatches between adjacent of the substrate 110, the first epitaxial layer 120, the second epitaxial layer 130, the third epitaxial layer 140, and the fourth epitaxial layer 143 are reduced, the threading dislocations (TDs) created from the interfaces between adjacent of the substrate 110, the first epitaxial layer 120, the second epitaxial layer 130, the third epitaxial layer 140, and the fourth epitaxial layer 143 are reduced as well.

In some embodiments, a lattice mismatch between the first epitaxial layer 120 and the substrate 110 may be greater than a lattice mismatch between the second epitaxial layer 130 and the substrate 110. In such embodiments, threading dislocations (TDs) tend to be created from the interface between the first epitaxial layer 120 and the substrate 110. Since the first epitaxial layer 120 is formed in the first recesses 112, the TDs created from the interface between the first epitaxial layer 120 and the substrate 110 can be trapped in the first recesses 112.

Similarly, in some embodiments, a lattice mismatch between the third epitaxial layer 140 and the second epitaxial layer 130 may be greater than a lattice mismatch between the fourth epitaxial layer 143 and the second epitaxial layer 130. In such embodiments, threading dislocations (TDs) tend to be created from the interface between the third epitaxial layer 140 and the second epitaxial layer 130. Since the third epitaxial layer 140 is formed in the second recesses 132, the TDs created from the interface between the third epitaxial layer 140 and the second epitaxial layer 130 can be trapped in the second recesses 132.

In some embodiments, the lattice parameter of at least one of the first epitaxial layer 120, the second epitaxial layer 130, the third epitaxial layer 140, and the fourth epitaxial layer 143 may be constant. In some other embodiments, the lattice parameter of at least one of the first epitaxial layer 120, the second epitaxial layer 130, the third epitaxial layer 140, and the fourth epitaxial layer 143 may vary along its thickness.

When the substrate 110 is made of silicon, and the first epitaxial layer 120, the second epitaxial layer 130, the third epitaxial layer 140, and the fourth epitaxial layer 143 are made of silicon-germanium or germanium, the lattice parameters of the substrate 110, the first epitaxial layer 120, the second epitaxial layer 130, the third epitaxial layer 140, and the fourth epitaxial layer 143 increase from the substrate 110 towards the direction away from the substrate 110. That is, the lattice parameter of the first epitaxial layer 120 is greater than the lattice parameter of the substrate 110, the lattice parameter of the second epitaxial layer 130 is greater than the lattice parameter of the first epitaxial layer 120, the lattice parameter of the third epitaxial layer 140 is greater than the lattice parameter of the second epitaxial layer 130, and/or the lattice parameter of the fourth epitaxial layer 143 is greater than the lattice parameter of the third epitaxial layer 140.

Since germanium has higher lattice parameter than that of silicon, the lattice parameter of silicon-germanium or germanium increases as its germanium content increases. Therefore, the germanium contents of the substrate 110, the first epitaxial layer 120, the second epitaxial layer 130, the third epitaxial layer 140, and the fourth epitaxial layer 143 increase from the substrate 110 towards the direction away from the substrate 110 when the substrate 110 is made of silicon, and the first epitaxial layer 120, the second epitaxial layer 130, the third epitaxial layer 140, and the fourth epitaxial layer 143 are made of silicon-germanium or germanium. That is, the germanium content of the first epitaxial layer 120 is greater than the germanium content of the substrate 110, the germanium content of the second epitaxial layer 130 is greater than the germanium content of the first epitaxial layer 120, the germanium content of the third epitaxial layer 140 is greater than the germanium content of the second epitaxial layer 130, and/or the germanium content of the fourth epitaxial layer 143 is greater than the germanium content of the third epitaxial layer 140.

In some embodiments, the germanium content of at least one of the first epitaxial layer 120, the second epitaxial layer 130, the third epitaxial layer 140, and the fourth epitaxial layer 143 may be constant. In some other embodiments, the germanium content of at least one of the first epitaxial layer 120, the second epitaxial layer 130, the third epitaxial layer 140, and the fourth epitaxial layer 143 may vary along its thickness.

In some embodiments, at least two of the first epitaxial layer 120, the second epitaxial layer 130, the third epitaxial layer 140, and the fourth epitaxial layer 143 may have different lattice parameters. In some other embodiments, at least two of the first epitaxial layer 120, the second epitaxial layer 130, the third epitaxial layer 140, and the fourth epitaxial layer 143 may have the same lattice parameter and may be made of the same material. In the embodiments that at least two of the first epitaxial layer 120, the second epitaxial layer 130, the third epitaxial layer 140, and the fourth epitaxial layer 143 have the same lattice parameter and are made of the same material, a interface between said at least two of the first epitaxial layer 120, the second epitaxial layer 130, the third epitaxial layer 140, and the fourth epitaxial layer 143 may be absent, and thus said at least two of the first epitaxial layer 120, the second epitaxial layer 130, the third epitaxial layer 140, and the fourth epitaxial layer 143 may be considered an epitaxial layer.

After the fourth epitaxial layer 143 is formed, a dopant implantation process is performed on the fourth epitaxial layer 143 to form active areas in the fourth epitaxial layer 143. The active areas will be used for components of active devices, such as re-channel metal-oxide-semiconductor field-effect transistors (n-channel MOSFETs), p-channel MOSFETs, planar MOSFETs, or fin field-effect transistors (finFETs), to be formed later. If an n-channel MOSFET will be formed on an active area, a p-well is formed in the active area. If a p-channel MOSFET will be formed on an active area, an n-well is formed in the active area.

If the fourth epitaxial layer 143 is made of a Group IV semiconductor material, such as germanium or silicon-germanium, the dopants can be acceptors from Group III or donors from Group V elements. For example, boron (B), aluminium (Al), indium (In), gallium (Ga), or combinations thereof, having three valence electrons, can be used as the dopants to form a p-well in the fourth epitaxial layer 143 when the fourth epitaxial layer 143 is made of a Group IV semiconductor material with four valence electrons. On the other hand, phosphorus (P), arsenic (As), antimony (Sb), bismuth (Bi), or combinations thereof, having five valence electrons, can be used as the dopants to form an n-well in the fourth epitaxial layer 143 when the fourth epitaxial layer 143 is made of a Group IV semiconductor material with four valence electrons.

In some embodiments, the active areas where p-channel metal-oxide-semiconductor field-effect transistors (p-channel MOSFETs) and n-channel MOSFETs will be formed are made of substantially the same material, such as germanium or silicon-germanium. In some other embodiments, the active areas where p-channel MOSFETs will be formed are made of germanium or silicon-germanium, and the active areas where n-channel MOSFETs will be formed are made of an III-V compound or III-V compounds. In such embodiments, the active areas where p-channel MOSFETs will be formed and the active areas where n-channel MOSFETs will be formed may be formed separately. That is, the first epitaxial layer 120, the second epitaxial layer 130, the third epitaxial layer 140, and the fourth epitaxial layer 143 are formed, patterned, and implanted to form some active areas, and then one or more other epitaxial layers are formed and implanted to form some other active areas.

Figure 17:
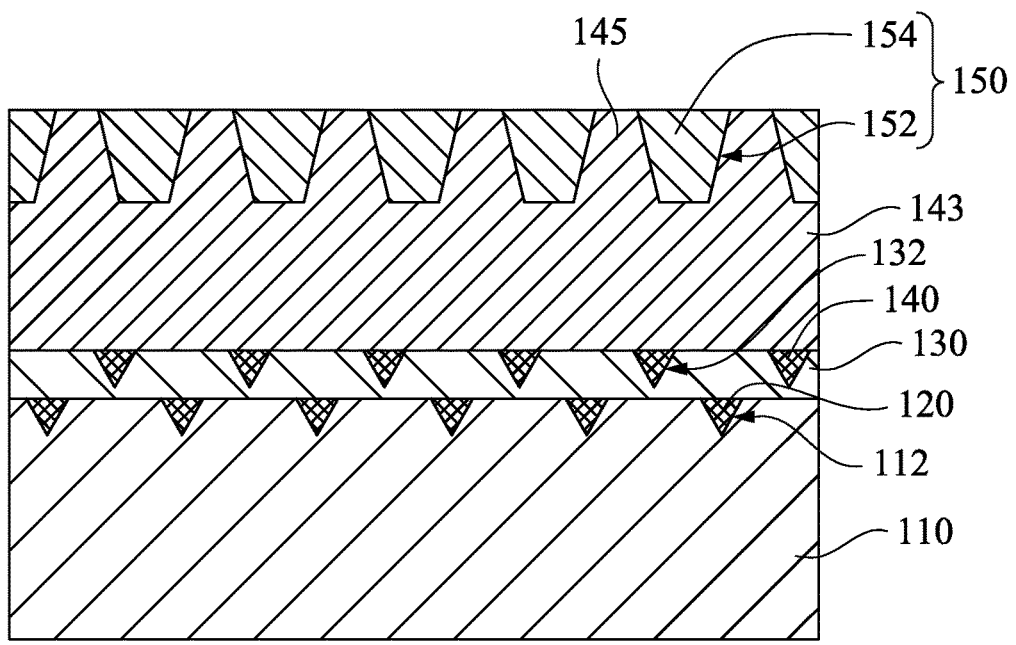

Reference is made to FIG. 17. A plurality of isolation structures 150 are formed at least partially in the fourth epitaxial layer 143 to separate the active areas 145. In some embodiments, the isolation structures 150 are, for example, shallow trench isolation (STI) structures. Specifically, a hard mask layer is formed on the fourth epitaxial layer 143 and is patterned to form openings therein to expose portions of the fourth epitaxial layer 143. Then, the exposed portions of the fourth epitaxial layer 143 are etched to form trenches 152 in the fourth epitaxial layer 143. The etching for forming the trenches 152 may be, for example, reactive-ion etching (RIE). After the formation of the trenches 152, a dielectric material 154 overfills the trenches 152. The dielectric material 154 is, for example, silicon oxide, silicon nitride, a cured flowable dielectric material, or combinations thereof. Then, the excess dielectric material 154 outside of the trenches 154 is removed by, for example, chemical mechanical polishing (CMP). After the CMP, the hard mask layer is removed from the fourth epitaxial layer 143 to form the isolation structures 150.

After the isolation structures 150 are formed, one or more process steps may be performed to form one or more components of active devices, such as n-channel metal-oxide-semiconductor field-effect transistors (n-channel MOSFETs), p-channel MOSFETs, planar MOSFETs, or fin field-effect transistors (finFETs), on the active areas 145. Since the threading dislocations (TDs) are trapped in the first recesses 112 and the second recesses 132, and the TDs created from the interfaces between the first epitaxial layer 120, the second epitaxial layer 130, the third epitaxial layer 140, and the fourth epitaxial layer 143 are reduced, the TDs in the active areas 145 can be eliminated or reduced to an acceptable level.

Some embodiments incorporate defect trap recesses into a heteroepitaxy structure. The defect trap recesses can trap threading dislocations (TDs) created from an interface between different materials and prevent the TDs from extending into active areas. Furthermore, the defect trap recesses are multidimensionally arranged, and thus the TDs extending along different directions can be trapped in the defect trap recesses.

According to some embodiments, a semiconductor structure includes a substrate, at least one first epitaxial layer, and at least one second epitaxial layer. The substrate has a plurality of recesses multidimensionally arranged therein. The first epitaxial layer is disposed at least in the recesses of the substrate. The second epitaxial layer is disposed on the first epitaxial layer.

According to some embodiments, a semiconductor structure includes at least one first crystalline layer and at least one second crystalline layer. The first crystalline layer has a plurality of recesses arranged along at least two crossing lines. The second crystalline layer is disposed in the recesses of the first crystalline layer and on the first crystalline layer.

According to some embodiments, a method for manufacturing a semiconductor structure is provided. The method includes forming a plurality of multidimensionally arranged first recesses in a first crystalline layer; and forming at least one second crystalline layer at least in the recesses of the first crystalline layer and at least one third crystalline layer on the second crystalline layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate having a plurality of recesses multidimensionally arranged therein;
   at least one first epitaxial layer disposed at least partially in the recesses of the substrate;
   at least one second epitaxial layer disposed on the first epitaxial layer, wherein the at least one second epitaxial layer is in contact with the at least one first epitaxial layer and the substrate; and
   an isolation structure including a dielectric material, the isolation structure being above the recesses in the substrate.

2. The semiconductor structure of claim 1, further comprising:
   at least one third epitaxial layer disposed on the second epitaxial layer.

3. The semiconductor structure of claim 2, wherein a lattice parameter of the second epitaxial layer is between a lattice parameter of the third epitaxial layer and a lattice parameter of the substrate.

4. The semiconductor structure of claim 1, wherein the second epitaxial layer has a plurality of recesses therein; and further comprising:
   at least one third epitaxial layer disposed at least partially in the recesses of the second epitaxial layer.

5. The semiconductor structure of claim 4, wherein the recesses of the second epitaxial layer are not aligned with the recesses of the substrate.

6. The semiconductor structure of claim 1, further comprising:
   a semiconductor layer over the second epitaxial layer,
   wherein the isolation structure is disposed at least partially in the semiconductor layer.

7. The semiconductor structure of claim 1, wherein a first lattice mismatch between the first epitaxial layer and the substrate is greater than a second lattice mismatch between the second epitaxial layer and the substrate.

8. The semiconductor structure of claim 1, wherein the recesses of the substrate are arranged in a staggered pattern.

9. The semiconductor structure of claim 1, wherein the recesses of the substrate are arranged in a non-staggered pattern.

10. A semiconductor structure, comprising:
    a substrate having a plurality of recesses separated from each other and arranged along at least two crossing lines;
    at least one first epitaxial layer disposed at least partially in the recesses of the substrate; and
    at least one second epitaxial layer disposed on the first epitaxial layer and having a lattice mismatch with the substrate.

11. The semiconductor structure of claim 10, wherein a lattice parameter of the first epitaxial layer is between a lattice parameter of the second epitaxial layer and a lattice parameter of the substrate.

12. The semiconductor structure of claim 10, wherein the second epitaxial layer has a plurality of recesses multidimensionally arranged therein.

13. The semiconductor structure of claim 12, further comprising:
    at least one third epitaxial layer disposed at least partially in the recesses of the second epitaxial layer.

14. The semiconductor structure of claim 13, wherein a lattice parameter of the second epitaxial layer is between a lattice parameter of the third epitaxial layer and a lattice parameter of the first epitaxial layer.

15. The semiconductor structure of claim 10, wherein a lattice mismatch between the first epitaxial layer and the substrate is greater than the lattice mismatch between the second epitaxial layer and the substrate.

16. The semiconductor structure of claim 10, wherein the second epitaxial layer has a plurality of recesses therein, and the recesses of the second epitaxial layer are staggered with the recesses of the substrate.

17. A semiconductor structure, comprising:
    a substrate having a plurality of recesses therein;
    at least one first epitaxial layer substantially filling the recesses of the substrate; and
    at least one second epitaxial layer disposed on the first epitaxial layer and having a plurality of recesses therein, wherein the recesses of the second epitaxial layer are staggered with the recesses of the substrate, and the at least one second epitaxial layer is in contact with the at least one first epitaxial layer and the substrate.

18. The semiconductor structure of claim 1, wherein the second epitaxial layer and the substrate have different materials.

19. The semiconductor structure of claim 10, further comprising:
   an isolation structure including a dielectric material and above the second epitaxial layer.

20. The semiconductor structure of claim 17, further comprising:
   an isolation structure above the recesses in the second epitaxial layer.

* * * * *